(12) United States Patent
Ho

(10) Patent No.: US 7,883,241 B2
(45) Date of Patent: Feb. 8, 2011

(54) ELECTRONIC DEVICE AND HEAT DISSIPATION UNIT THEREOF

(75) Inventor: Ming Yuan Ho, Taipei (TW)

(73) Assignee: ASUSTek Computer Inc., Taipei (TW)

( * ) Notice: Subject to any disclaimer, the term of this patent is extended or adjusted under 35 U.S.C. 154(b) by 155 days.

(21) Appl. No.: 12/394,952

(22) Filed: Feb. 27, 2009

(65) Prior Publication Data

US 2009/0279301 A1    Nov. 12, 2009

(30) Foreign Application Priority Data

May 6, 2008    (TW) ............... 97116616 A

(51) Int. Cl.
*F21S 4/00* (2006.01)
*F21V 21/00* (2006.01)

(52) U.S. Cl. ............. 362/249.02; 362/294; 362/311.02; 362/800

(58) Field of Classification Search ............ 362/249.02, 362/294, 311.02, 800
See application file for complete search history.

(56) References Cited

FOREIGN PATENT DOCUMENTS

| CN | 2835661 Y | 11/2006 |
|----|-----------|---------|
| CN | 1884843 A | 12/2006 |
| TW | D101545   | 11/2004 |

*Primary Examiner*—Jason Moon Han

(57) ABSTRACT

A heat dissipation unit is provided. The heat dissipation unit includes a fan, a heat sink and a light source. The heat sink includes a plurality of heat dissipating fins, a light transmitting plate, an air inlet and an air outlet, wherein the heat dissipating fins are disposed in the heat sink, and the light transmitting plate is disposed on a surface of the heat sink. The light source corresponds to the light transmitting plate, wherein the light source provides a light beam, the light beam passes the light transmitting plate and introduces into the heat sink, and introduces out the heat sink through the air outlet.

12 Claims, 3 Drawing Sheets

ELECTRONIC DEVICE AND HEAT DISSIPATION UNIT THEREOF

CROSS REFERENCE TO RELATED APPLICATIONS

This Application claims priority of Taiwan Patent Application No. 097116616, filed on May 6, 2008, the entirety of which is incorporated by reference herein.

BACKGROUND OF THE INVENTION

1. Field of the Invention

The present invention relates to a heat dissipation unit, and in particular relates to a heat dissipation unit providing increased brightness and illumination.

2. Description of the Related Art

FIG. 1 shows a conventional heat dissipation unit 1 comprising a fan 10 and a heat sink 20. A plurality of light sources 11 are disposed in the fan 10. The light sources 11 provide light beams 12. The light beams 12 are emitted from the fan 10, and pass the heat sink 20 to provide illumination. Simultaneously, the fan 10 activates a flow 13. The flow 13 passes the heat sink 20 to remove heat therefrom. Conventionally, additional wires 14 are connected to the light sources 11 to transmit electricity to the light sources 11. The light sources 11 are projected from an inner wall of the fan 10 to face the heat sink 20 for improved lighting efficiency. However, the projected light sources 11 increase flow resistance, change flow field of the flow 13, and decreases heat dissipation efficiency.

BRIEF SUMMARY OF THE INVENTION

A detailed description is given in the following embodiments with reference to the accompanying drawings.

A heat dissipation unit is provided. The heat dissipation unit comprises a fan, a heat sink and a light source. The heat sink comprises a plurality of heat dissipating fins, a light transmitting plate, an air inlet and an air outlet, wherein the heat dissipating fins are disposed in the heat sink, and the light transmitting plate is disposed on a surface of the heat sink. The light source corresponds to the light transmitting plate, wherein the light source provides a light beam, and the light beam passes the light transmitting plate and introduces into the heat sink, and introduces out the heat sink through the air outlet.

In the embodiment of the invention, the light sources are incorporated on a circuit board. Therefore, there is no additional wire connected to the light sources. As well, the light sources are disposed away from the path of the flow so that flow resistance is reduced, and dissipation efficiency is improved. Additionally, in the embodiment of the invention, the light sources are disposed closer to the air outlet, and the light beams are utilized more efficiently to provide increased brightness and illumination.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
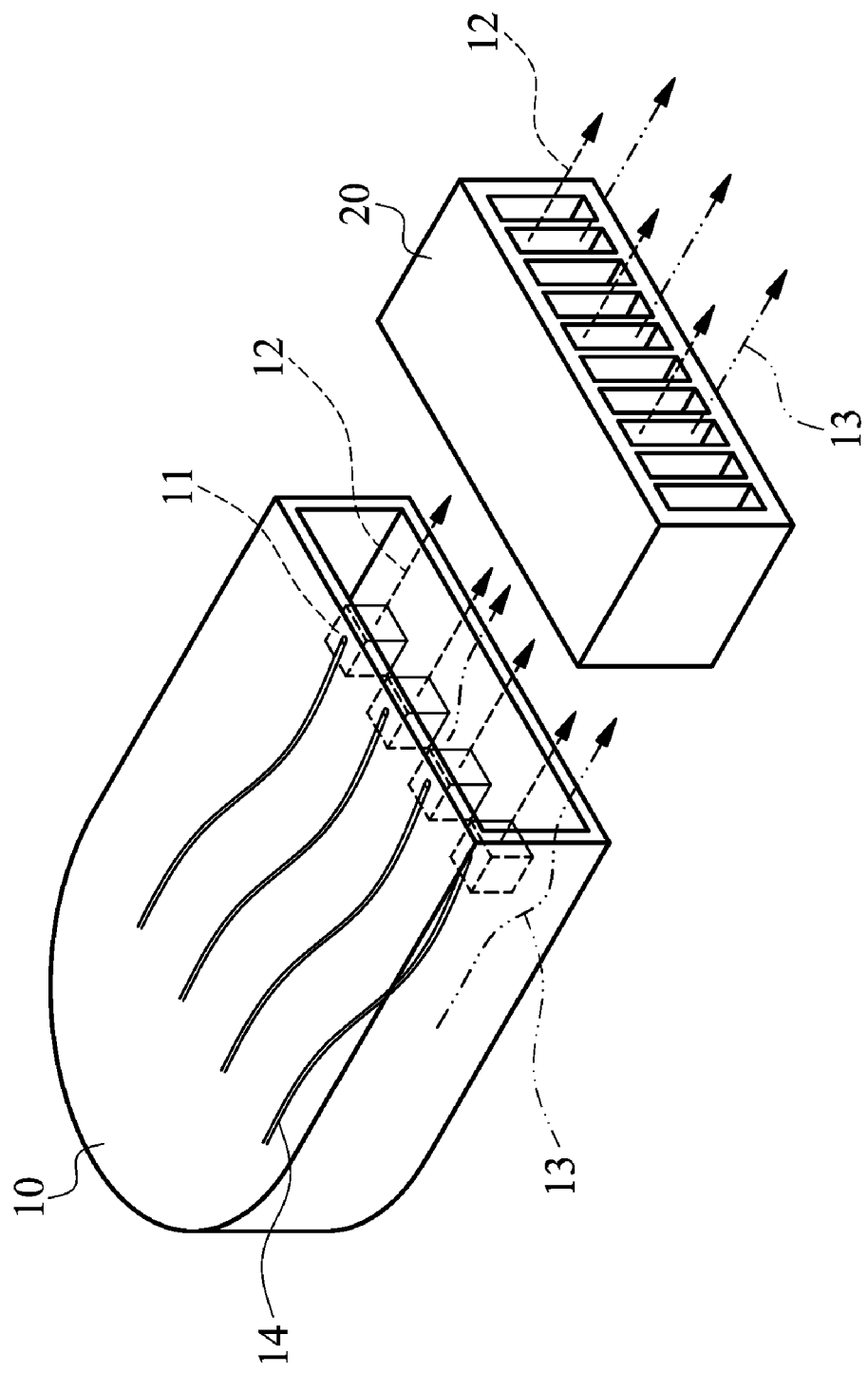
FIG. 1 shows a conventional heat dissipation unit.
Figure 2:
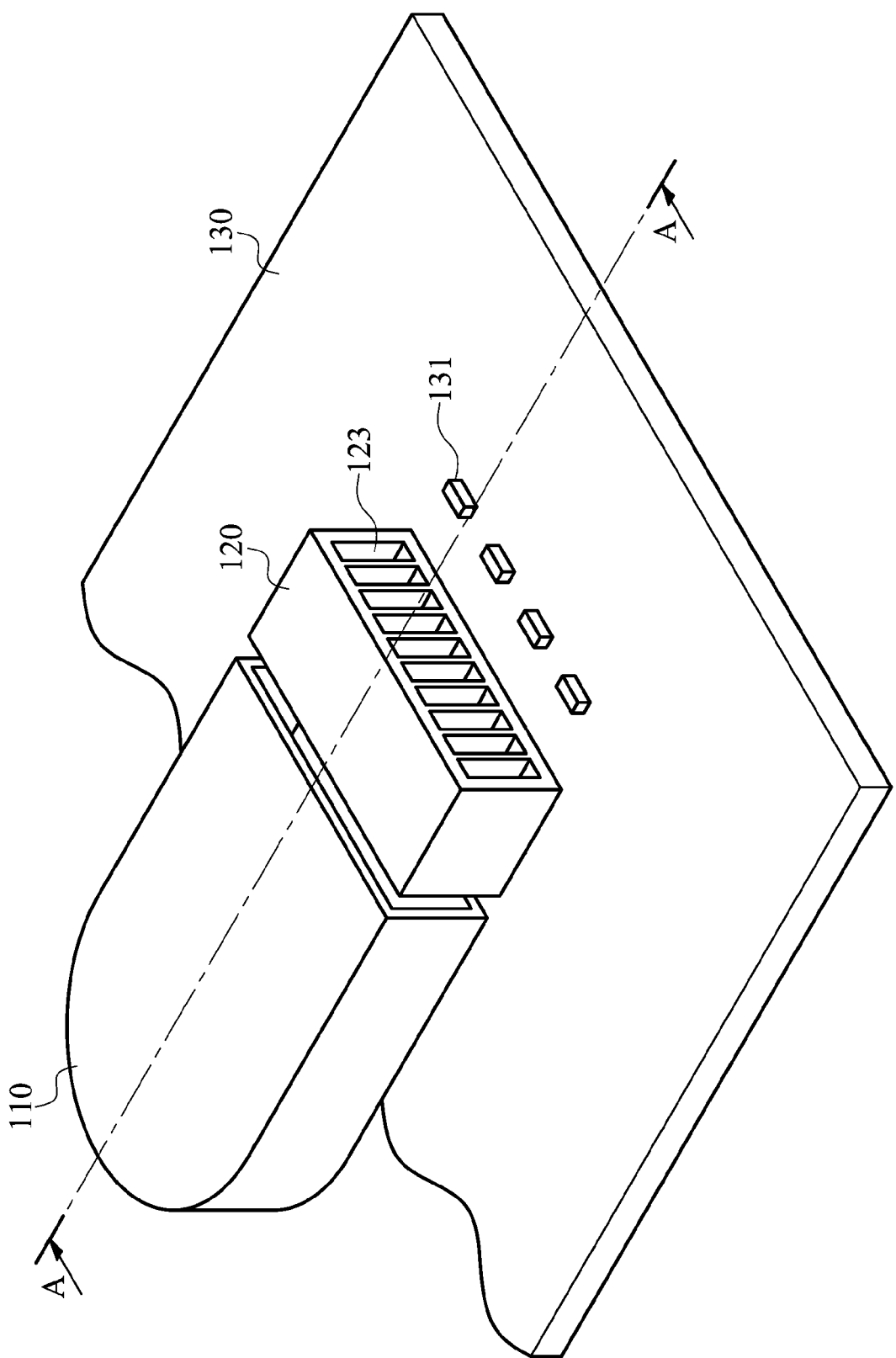
FIG. 2 shows an electronic device of an embodiment of the invention.

FIG. 2 shows an electronic device 100 of an embodiment of the invention, comprising a fan 110, a heat sink 120 and a circuit board 130. The fan 110 and the heat sink 120 compose a heat dissipation unit.

Figure 3:
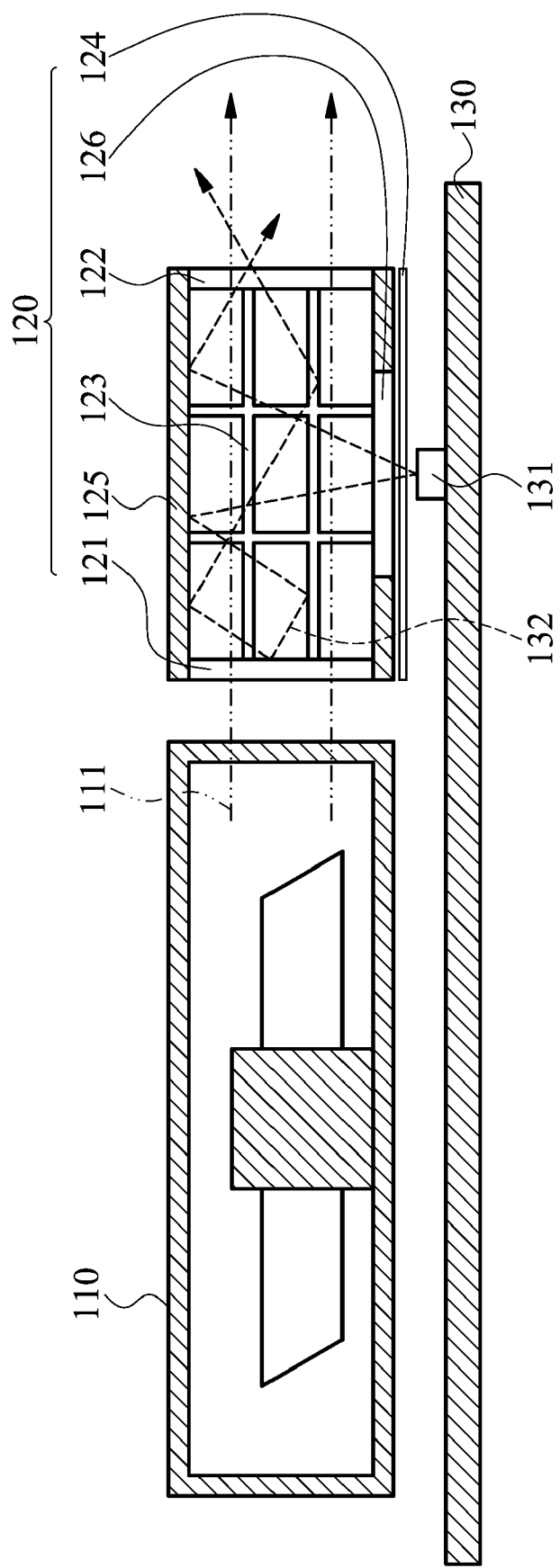
FIG. 3 is a sectional view in A-A direction of FIG. 2.

FIG. 3 is a sectional view in A-A direction of FIG. 2. With reference to FIGS. 2 and 3, the heat sink 120 comprises an air inlet 121, an air outlet 122, heat dissipating fins 123, a light transmitting plate 124, a heat dissipation plane 125 and a light inlet 126. The light transmitting plate 124 is disposed on a surface of the heat sink 120 covering the light inlet 126. The heat dissipation plate 125 is parallel to the light transmitting plate 124 and corresponding thereto. The air inlet 121 is corresponding to the air outlet 122. The light transmitting plate 124 is located on a first plane, and the air inlet 121 is located on a second plane. The first plane is perpendicular to the second plane.

The heat dissipation plane 125 can be integrally formed on the top of the heat sink 120, or adhered to the top of the heat sink 120. In a modified embodiment, a heat insulation layer replaces the heat dissipation plane, and is disposed on the top of the heat sink 120.

The fan 110 activates a flow 111. The flow 111 enters the heat sink 120 through the air inlet 121, and exits the heat sink 120 through the air outlet 122 to remove heat out of the electronic device 100 from the heat sink 120.

A plurality of light sources 131 are formed on the circuit board 130. The light sources 131 correspond to the light transmitting plate 124, and provide light beams thereto. The light beams 132 pass the light transmitting plate 124, to introduce into the heat sink 120, and is reflected by the heat dissipating fins 123 and the heat dissipation plane 125, and introduces out the heat sink 120 through the air outlet 122.

The light transmitting plate 124 can be formed by transparent or translucent material, such as Mylar.

In the embodiment of the invention, the light transmitting plate 124 is adhered to the heat sink 120 to seal the light inlet 126 and prevent the flow 111 from leaking through the light inlet 126.

In the embodiment of the invention, the light sources are incorporated on a circuit board. Therefore, there is no additional wire connected to the light sources. As well, the light sources are disposed away from the path of the flow so that flow resistance is reduced, and dissipation efficiency is improved. Additionally, in the embodiment of the invention, the light sources are disposed closer to the air outlet, and the light beams are utilized more efficiently to provide increased brightness and illumination.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A heat dissipation unit, comprising:
   a fan;
   a heat sink, comprising a plurality of heat dissipating fins, a light transmitting plate, an air inlet and an air outlet to receive flow from the fan, wherein the heat dissipating fins are disposed in the heat sink, and the light transmitting plate is disposed on a surface of the heat sink; and a light source, corresponding to the light transmitting plate, wherein the light source provides a light beam, and the light beam passes the light transmitting plate, and enters into the heat sink, and passes out of the heat sink.

2. The heat dissipation unit as claimed in claim 1, wherein the heat sink further comprises a heat dissipation plane, the heat dissipation plane is parallel and corresponds to the light transmitting plate.

3. The heat dissipation unit as claimed in claim 2, wherein the light beam enters into the heat sink, is reflected by the heat dissipating fins and the heat dissipation plane, and passes out of the heat sink through the air outlet.

4. The heat dissipation unit as claimed in claim 1, wherein the light transmitting plate is located on a first plane, the air inlet is located on a second plane, and the first plane is perpendicular to the second plane.

5. The heat dissipation unit as claimed in claim 1, wherein the light pervious plate is transparent.

6. The heat dissipation unit as claimed in claim 1, wherein the light pervious plate is translucent.

7. A heat dissipation unit, comprising:

a fan;

a heat sink, comprising a plurality of heat dissipating fins, a light inlet, an air inlet and an air outlet to receive flow the fan, wherein the heat dissipating fins are disposed in the heat sink, and the light inlet is formed on a surface of the heat sink; and a light source, corresponding to the light inlet, wherein the light source provides a light beam, and the light beam passes the light inlet to enter into the heat sink, and passes out of the heat sink.

8. The heat dissipation unit as claimed in claim 7, wherein the heat sink further comprises a heat dissipation plane, and the heat dissipation plane corresponds to the light inlet.

9. The heat dissipation unit as claimed in claim 8, wherein the light beam enters into the heat sink, is reflected by the heat dissipating fins and the heat dissipation plane, and passes out of the heat sink through the air outlet.

10. The heat dissipation unit as claimed in claim 7, wherein the light inlet is located on a first plane, the air inlet is located on a second plane, and the first plane is perpendicular to the second plane.

11. An electronic device, comprising:

a fan, activating a flow;

a heat sink, comprising a plurality of heat dissipating fins, a light inlet, an air inlet and an air outlet for the flow, wherein the heat dissipating fins are disposed in the heat sink, the light inlet is formed on a surface of the heat sink, and the flow entering the heat sink through the air inlet and exiting from the heat sink through the air outlet; and a circuit board, comprising a light source corresponding to the light inlet, wherein the light source provides a light beam, and the light beam enters into the heat sink through the light inlet and passes out the heat sink through the air outlet.

12. The electronic device as claimed in claim 11, wherein the heat sink further comprises a light transmitting plate covering the light inlet, the light beam passes the light transmitting plate and the light inlet to introduce into the heat sink, and introduces out the heat sink through the air outlet.

* * * * *